United States Patent
Yasaitis

(10) Patent No.: US 7,205,525 B2
(45) Date of Patent: Apr. 17, 2007

(54) LIGHT CONVERSION APPARATUS WITH TOPSIDE ELECTRODE

(75) Inventor: John Yasaitis, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 299 days.

(21) Appl. No.: 10/656,850

(22) Filed: Sep. 5, 2003

(65) Prior Publication Data

US 2005/0051705 A1   Mar. 10, 2005

(51) Int. Cl.
    *H01L 31/00* (2006.01)
(52) U.S. Cl. .................. 250/214.1; 257/222
(58) Field of Classification Search ....... 250/214 R, 250/214.1; 257/222, 225, 228, 290, 431–432, 257/440; 438/48, 57, 69
    See application file for complete search history.

(56) References Cited

U.S. PATENT DOCUMENTS

| | | | |
|---|---|---|---|
| 5,414,275 A | 5/1995 | Sugawa et al. ............... 257/53 |
| 5,426,069 A * | 6/1995 | Selvakumar et al. .......... 438/60 |
| 5,556,423 A | 9/1996 | Chow et al. ................... 607/54 |
| 6,278,102 B1 | 8/2001 | Hook et al. .............. 250/208.1 |
| 6,514,785 B1 * | 2/2003 | Chiang et al. ................ 438/48 |
| 6,580,109 B1 * | 6/2003 | Thomas et al. ............. 257/292 |
| 2002/0145139 A1 | 10/2002 | Wagner et al. ................ 257/53 |
| 2003/0022466 A1 | 1/2003 | Escalera et al. ............ 438/478 |

OTHER PUBLICATIONS

Douglas D. Cannon, et al, Near-infrared Ge Photodetectors Fabricated with CMOS Technology, Department of Materials Science and Engineering, Massachusetts Institute of Technology, Apr. 2003.

\* cited by examiner

*Primary Examiner*—Stephone B. Allen
*Assistant Examiner*—Patrick J. Lee
(74) *Attorney, Agent, or Firm*—Bromberg & Sunstein, LLP

(57) ABSTRACT

A light conversion apparatus has a germanium-based photodiode, and a polysilicon-based receiving electrode for receiving light to be converted by the photodiode. The receiving electrode is coupled with the photodiode and permits the received light to substantially pass through it to the photodiode. The photodiode is capable of converting the received light into an electrical signal.

19 Claims, 3 Drawing Sheets

LIGHT CONVERSION APPARATUS WITH TOPSIDE ELECTRODE

FIELD OF THE INVENTION

The invention generally relates to photodiodes and, more particularly, the invention relates to electrical contacts for photodiodes.

BACKGROUND OF THE INVENTION

A wide variety of applications use photodiodes to convert optical signals into electrical signals. In practice, however, photodiodes typically are custom made for specific applications. For example, many optical telecommunications applications transmit light having wavelengths of between 850 to 1600 nanometers. The materials and properties of photodiodes used in those applications thus are selected to ensure optimal operation with light having those wavelengths.

To that end, many optical telecommunications applications use germanium-based photodiodes (i.e., photodiodes having primarily germanium and some other element, such as a group four element), which operate satisfactorily with the anticipated wavelengths. This type of photodiode (e.g., a germanium-based PIN photodiode), however, still has a number of operational problems.

Specifically, as background, a germanium PIN photodiode has an n-type doped region, a p-type doped region, and an intrinsic region (i.e. slightly doped or not doped) between the two doped regions. A sufficient potential difference is applied between the doped regions, which produces a current when illuminated by light of the intended signal wavelength. The strength of the resultant photocurrent is based upon the amount of incoming light signal absorbed by the intrinsic region. Optically generated electron-hole pairs in heavily doped germanium, however, typically have a short lifetime as minority carriers and rapidly recombine. Consequently, such pairs do not reach the proper photodiode electrode to contribute to the output current. Accordingly, to maximize the amount of light absorbed by the intrinsic region, the thickness of the doped regions is minimized relative to that of the intrinsic region.

Reducing the thickness of the doped regions (especially the doped region first receiving the incoming light—often referred to as the "topside electrode"), however, reduces their conductivity. Consequently, the photodiode cannot easily transmit the current it produces. In other words, current produced by an incoming light signal still effectively is attenuated because the doped regions do not have enough conductivity to transmit the current to an attached lead or other current transmission device.

The art has responded to this problem in a number of ways. One solution increases conductivity by coupling metal electrodes to the doped region that receives the light to be converted. Undesirably, however, the metal electrodes block some of the incoming light signal, still attenuating the resultant electrical signal. Moreover, because of thermal and material mismatches, germanium-based photodiodes present additional challenges when integrated with silicon integrated circuits (e.g., CMOS or bipolar technologies).

SUMMARY OF THE INVENTION

In accordance with one aspect of the invention, a light conversion apparatus has a germanium-based photodiode, and a polysilicon-based receiving electrode for receiving light to be converted by the photodiode. The receiving electrode is coupled with the photodiode and permits the received light to substantially pass through it to the photodiode. The photodiode is capable of converting the received light into an electrical signal.

In some embodiments, the receiving electrode is doped, such as with an n-type dopant. In other embodiments, the receiving electrode may substantially cover the entire top surface of the photodiode. Moreover, among other things, the apparatus also may include a bottom electrode coupled to photodiode. The apparatus further may have a voltage between the top and bottom electrodes. The receiving electrode preferably is relatively thin, such as between about 0.1 and 0.3 microns. Moreover, the apparatus also may have a waveguide coupled with the receiving electrode.

In still other embodiments, the photodiode has a p-type doped region, an n-type doped region, and an intrinsic region between the two doped regions. The receiving electrode is one of n-type or p-type doped, and is coupled closer to the doped region of the photodiode having a like doping to it than to the doped region of the photodiode having a different doping.

In accordance with another aspect of the invention, a light conversion apparatus has a photodiode with an n-type region that is doped with n-type dopant, and a p-type region that is doped with p-type dopant. The light conversion apparatus also has a polysilicon-based receiving electrode doped with one of an n-type or a p-type dopant. The receiving electrode is capable of receiving light to be converted by the photodiode and permits the received light to substantially pass through it to the photodiode. Moreover, the receiving electrode is coupled closer to the doped region of the photodiode having a like doping to it than to the doped region of the photodiode having a different doping.

By way of example, the receiving electrode may be doped with an n-type dopant. In that case, the receiving electrode may be coupled closer to the n-type region of the photodiode than to the p-type region of the photodiode. In some embodiments, the receiving electrode has no less than about a ninety percent concentration of polysilicon (e.g., at least a ninety percent concentration of polysilicon in polysilicon germanium).

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, a photodiode has a topside electrode that is substantially transparent to optical signals having wavelengths within an expected range. For example, the topside electrode may be produced from a polysilicon-based material and thus, be substantially transparent to optical signals having wavelengths between about 850 and 1600 nanometers. Accordingly, in such embodiments, the photodiode may effectively receive and transmit the substantial majority of optical data it receives through the topside electrode. Details of illustrative embodiments are discussed below.

Figure 1:
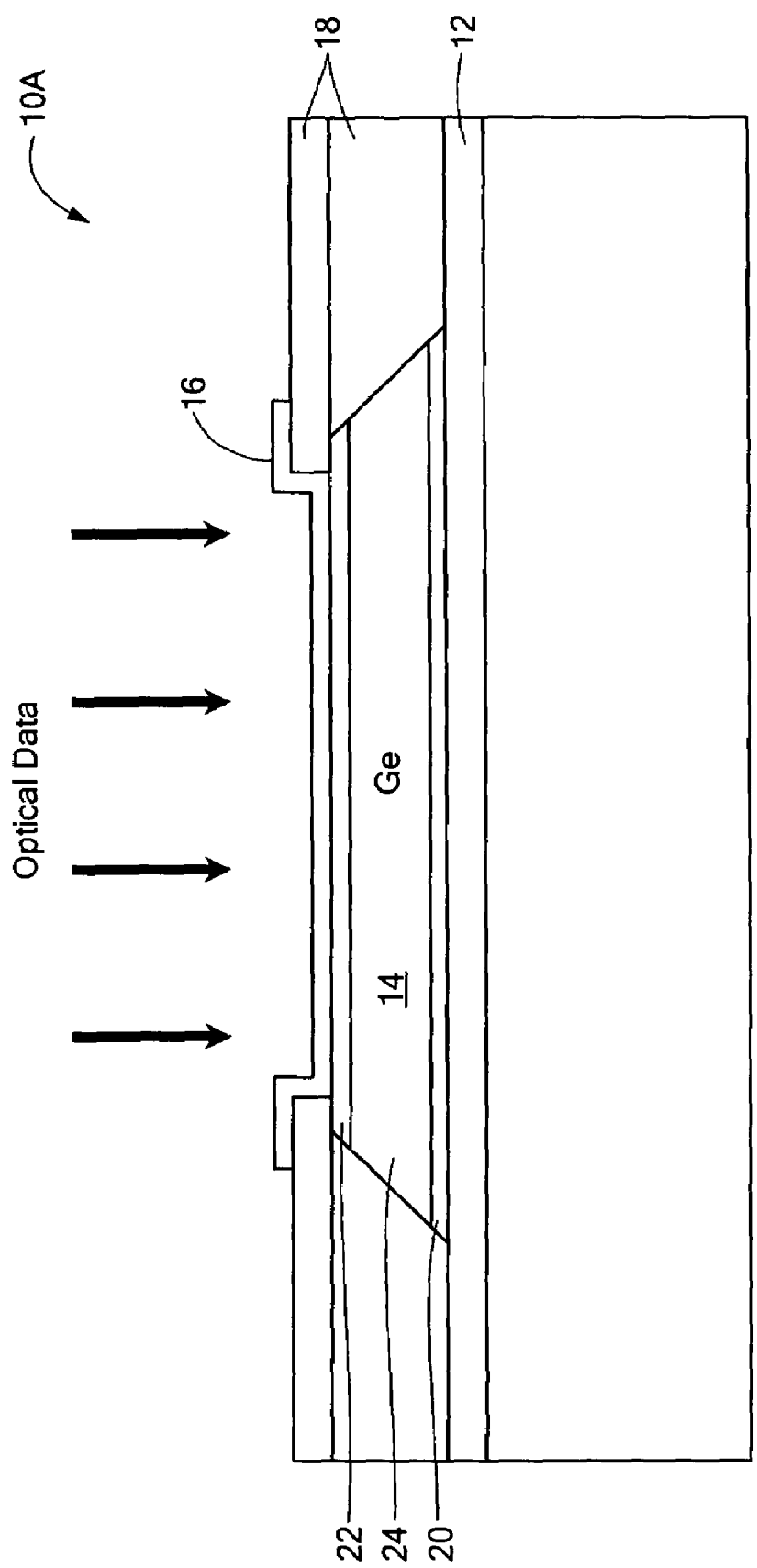
FIG. 1 schematically shows a cross-sectional view of a photodiode configured in accordance with one embodiment of the invention.

FIG. 1 schematically shows a light conversion apparatus (hereinafter "apparatus 10A") configured in accordance with illustrative embodiments of the invention. As an example to simplify understanding of the various embodiments, the apparatus 10A illustratively is used in conventional telecommunications applications. Consequently, as noted above, the apparatus 10A operates on optical signals having wavelengths between about 850 and 1600 nanometers. Accordingly, the light conversion apparatus 10A shown in FIG. 1 receives incoming optical data signals within that optical spectrum from a free space transmission medium, converts the optical signals into electrical signals, and transmits the resulting electrical signals to another electronic component or system.

To those ends, the apparatus 10A has a single-crystal silicon base layer 12, a PIN photodiode 14 to convert the optical signals to electrical signals, and a topside electrode 16 (also referred to as a "receiving electrode") to transmit the electrical signals produced by the photodiode 14 to other components. The apparatus 10A also has an insulator layer 18 (e.g., an oxide) between portions of the topside electrode 16 and the photodiode 14.

As known by those in the art, the PIN photodiode 14 has a p-type doped region 20, an n-type doped region 22, and a lightly doped (or undoped) intrinsic region 24 between the two doped regions. Under an appropriate reverse bias across the photodiode, the receipt of photons of sufficient intensity causes hole/electron pairs within the photodiode 14 to produce a measurable current flow between the two doped regions, thus producing an electrical signal. In other words, received photons (i.e., optical signals) produce a photogenerated current representing the received optical signal. As noted above, the topside electrode 16 transmits the resulting electric signal from the photodiode 14. Additionally, to facilitate use, the PIN photodiode 14 has a bias voltage applied across its electrodes (i.e., across its heavily doped regions).

Figure 2:
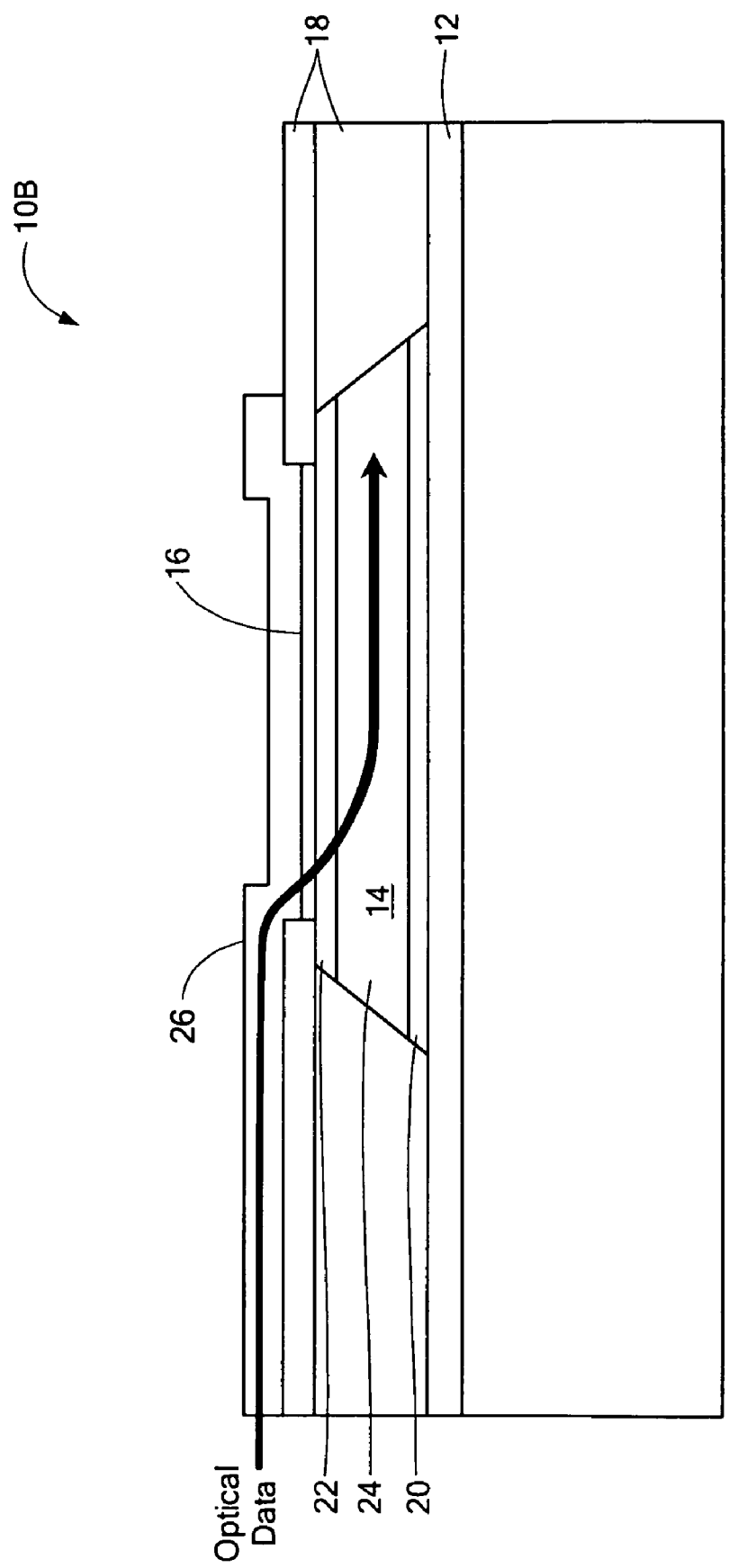
FIG. 2 schematically shows a cross-sectional view of a photodiode configured in accordance with an other embodiment of the invention.

FIG. 2 schematically shows a light conversion apparatus 10B similar to that shown in FIG. 1. Accordingly, the apparatus 10B includes the PIN photodiode 14, single-crystal silicon base layer 12, and topside electrode 16. Unlike the apparatus 10A shown in FIG. 1, however, the apparatus 10B shown in FIG. 2 uses evanescent coupling to receive optical signals. To that end, the topside electrode 16 of the apparatus 10B in FIG. 2 is coupled with an optical waveguide 26.

Figure 3:
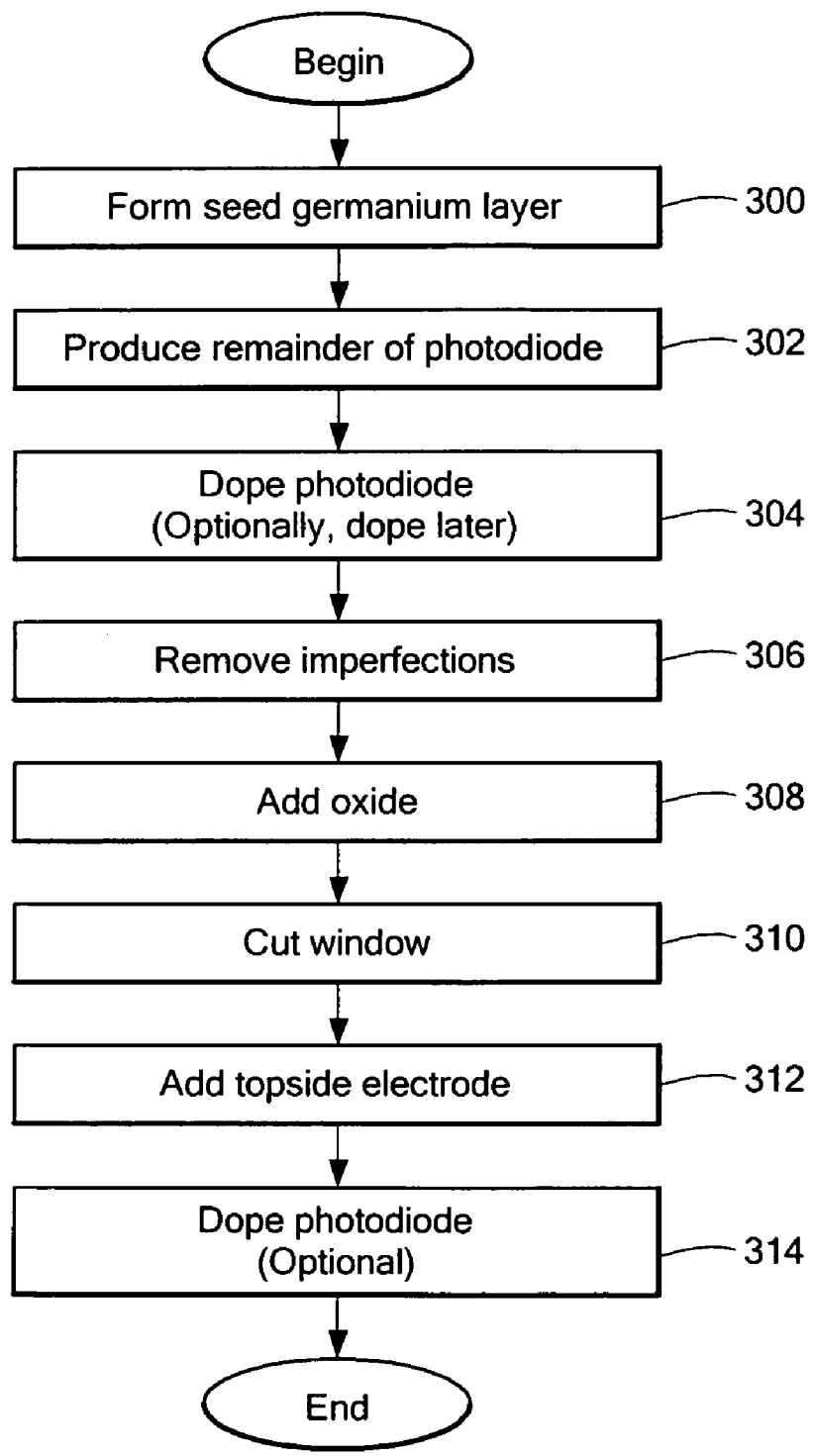
FIG. 3 shows a process of forming a photodiode in accordance with illustrative embodiments of the invention.

FIG. 3 shows a process of forming a light conversion apparatus (10A or 10B) in accordance with various embodiments of the invention. The process begins at step 300, in which a seed germanium layer is epitaxially grown on the single-crystal silicon base layer 12 in a conventional manner using a low pressure or ultra-high vacuum CVD film growth process. For example, a boron doped p-type single-crystal silicon wafer with a resistivity of less than about 0.002 ohm-centimeters may be used as the substrate for the seed layer. Additionally, it is anticipated that growth temperatures between about 300 degrees C. and 400 degrees C. should satisfactorily grow the seed germanium layer. When developing prototype photodiodes for these purposes, however, temperatures of between about 325 degrees C. and 350 degrees C. provided satisfactory results.

The process then continues to step 302, in which the remainder of the germanium layer 14 is produced. Accordingly, after the seed germanium layer is formed, the epitaxial growth temperature is significantly raised to temperatures between about 550 degrees C. and 800 degrees C. Such high temperatures should be sufficient to grow the remainder of the photodiode 14.

In alternative embodiments, another germanium-based material (i.e., other than pure germanium, which also is considered to be germanium-based) may be used to produce the photodiode 14. For example, material having about a seventy percent (or greater) concentration of germanium with some other Group 4 element may be used to produce the photodiode 14. Among others, such a germanium-based photodiode 14 may comprise germanium-tin, or germanium-carbon. Of course, the temperatures of the epitaxial growth are dependent upon the final concentrations of materials within the final germanium-based photodiode 14.

After the remainder of the photodiode 14 is produced, it may be doped in a conventional manner as specified by the particular application (step 304). In the embodiments shown in FIGS. 1 and 2, the photodiode 14 is doped in a manner that produces the above noted three regions 20, 22, and 24. Specifically, the photodiode 14 is doped to produce the p-type doped region 20, the n-type doped region 22, and the intrinsic region 24 between the two doped regions. In illustrative embodiments, the p-type doped region 20 is immediately adjacent to the single-crystal silicon base layer 12, while the n-type doped region 22 forms a top diode surface. The p-type doped region 20 illustratively is doped by conventional outdiffusion from the p-type doped single-crystal silicon base. In alternative embodiments, rather than dope the region 22 at this time in the process, it is doped later at 314, i.e., after the topside electrode 16 is formed. Details of this embodiment are discussed below.

It should be noted that there are no sharp boundaries defining when a material is "heavily doped" and when it is "lightly doped." Nevertheless, as an example, a material may be considered to be "heavily doped" when it is doped to an extent that is greater than about 1E19/cm3. In a similar manner, as a further example, a material may be considered to be "lightly doped" when it is doped to an extent that is less than about 1E16/cm3.

Steps 300 to 302 thus produce a substantially complete photodiode 14 by using conventional processes (e.g., UHV-CVD). Step 306 then removes imperfections in the internal lattice structure. To that end, the substantially complete photodiode 14 may be cyclical annealed at temperatures ranging from between about 600 degrees C. to 900 degrees C. When growing the photodiode 14 out of pure germanium, for example, the temperature should not exceed 900 degrees C. to avoid approaching the melting point of germanium (about 937 degrees C.). In a manner similar to other noted process steps, the temperature should be selected based upon the material forming the photodiode 14.

In illustrative embodiments, this process produces a photodiode 14 having a total thickness of about 1.4 to 1.5 microns. Specifically, the heavily doped outer regions 20 and 22 (i.e., the electrodes of the photodiode 14) may have thicknesses of about 0.1 microns, while the intrinsic region 24 has a thickness of about 1.2 to 1.3 microns. The relative thicknesses of the intrinsic and doped regions thus ensure that the substantial majority of photon energy will be absorbed by the intrinsic region 24. Those in the art should understand, however, that the specific thicknesses discussed herein are exemplary and not intended to limit the invention. Accordingly, photodiodes with doped and undoped regions having different thicknesses can be used and still should produce satisfactory results, depending upon the specific application.

After the photodiode 14 is formed, then the remaining steps facilitate the addition of the polysilicon-based topside electrode 16 and, in some embodiments, doping of the top germanium layer (i.e., the n-type doped region 22). Specifically, the insulator layer 18 is deposited onto the top surface of the photodiode 14 for germanium passivation and to act as an implant mask (step 308). A window then may be opened through the insulator layer 18 to expose the underlying germanium (step 310). In illustrative embodiments, the window size may be circularly shaped and have a diameter that ranges from about 10 to 300 microns. The window size thus determines the diode size. The exposed portion of the photodiode 14 (i.e., within the window) illustratively is considered to form the entire top surface of the photodiode 14.

The process then continues to step 312, in which the topside electrode 16 is formed across the entire exposed portion of the photodiode 14 in accordance with conventional processes. To that end, a heavily n-doped polysilicon-based layer (in-situ doped polysilicon) having a thickness of between about 0.1 and 0.3 microns can be deposited across the entire exposed window portion. In some embodiments, rather than perform step 304 for the layer 22, subsequent annealing can dope such layer to produce the n-type doped region 22 by outdiffusion. Alternatively, undoped polysilicon can be deposited and a phosphorous implant, for example, can form the junction. In another embodiment, a combination of in-situ doped and ion implantation can be used to precisely tailor the n-type doped layer 22.

In illustrative embodiments, a material is considered to be a "polysilicon-based" material if it is pure polysilicon, or if it has a substantial majority of polysilicon with a small amount of an additional material, such as a Group 4 material. For example, polysilicon-germanium is considered a polysilicon-based material.

Using a polysilicon-based topside electrode has a number of advantages. Among others, polysilicon has a higher bandgap than that of germanium and thus, absorbs photons at a relatively low rate when compared to germanium. When the apparatus parameters (e.g., thickness, doping, material concentrations, etc . . . ) are properly selected, the polysilicon-based topside electrode should insignificantly attenuate incoming optical signals. In other words, the topside electrode effectively is optically transparent for anticipated wavelengths of optical telecommunications applications. For example, prototypes have permitted about 97 percent of an incoming optical telecommunications signal to be transmitted through the topside electrode. At the same time, such prototypes have provided a relatively short diffusion length for photo-generated carriers to the top polysilicon electrode 16 for transmission as an electrical signal current.

The described topside electrode also permits the n-type doped region 22 of the photodiode 14 to have a reduced vertical profile, thus reducing its thickness relative to the intrinsic region 24. As noted above, this reduced profile permits a larger portion of an incoming optical signal to be absorbed by the intrinsic region 24 of the photodiode 14, consequently enhancing its response.

As an additional benefit, because it is polysilicon, the overall apparatus 10 can be easily integrated into conventional silicon based processes (e.g., standard CMOS and BiMOS processes used in microelectronic integrated circuit applications). Moreover, n-type doped polysilicon is highly conductive and thus, should transmit the resulting electric signal from the photodiode 14 in an efficient manner.

In alternative embodiments, the doping is reversed. It is desirable, however, to ensure that the topside electrode is doped to the same polarity as that of the top region of the photodiode 14. In a similar manner, the single-crystal silicon base layer 12 illustratively is doped to the same polarity as the bottom region as that of the photodiode 14.

Although noted above, it should be reiterated that discussion of specific apparatus parameters, such as temperatures, dimensions, doping types, wavelengths, materials, etc . . . are exemplary of various embodiments of the invention. Accordingly, their discussion is not intended to limit the scope of all embodiments of the invention. Those skilled in the art can vary the device parameters to some extent and still remain within the scope and spirit of the invention.

Although various exemplary embodiments of the invention are disclosed above, it should be apparent to those skilled in the art that various changes and modifications can be made that will achieve some of the advantages of the invention without departing from the true scope of the invention.

What is claimed is:

1. A light conversion apparatus comprising:
   a germanium-based photodiode; and
   a polysilicon-based receiving electrode for receiving light to be converted by the photodiode, wherein the receiving electrode permits the received light to substantially pass through the receiving electrode to the photodiode, the photodiode generates photogenerated carriers from the received light, and the receiving electrode is electrically coupled with the photodiode to extract the photogenerated carriers from the germanium-based photodiode and conduct the collected photogenerated carriers to another component.

2. The apparatus as defined by claim 1 wherein the receiving electrode is doped.

3. The apparatus as defined by claim 2 wherein the receiving electrode is doped with an n-type dopant.

4. The apparatus as defined by claim 1 further comprising a bottom electrode coupled to the photodiode, the apparatus further having a voltage between the top and bottom electrodes.

5. The apparatus as defined by claim 1 further including a waveguide coupled with the receiving electrode.

6. The apparatus as defined by claim 1 wherein the photodiode has an p-type doped region, an n-type doped region, and an intrinsic region between the two doped regions, the receiving electrode being one of n-type or p-type doped regions, the receiving electrode being coupled closer to the doped region of the photodiode having a like doping to it than to the doped region of the photodiode having a different doping.

7. A light conversion apparatus comprising:
   a germanium-based photodiode having an n-type region that is doped with n-type dopant and a p-type region that is doped with p-type dopant; and
   a polysilicon-based receiving electrode doped with one of an n-type or a p-type dopant, wherein the receiving electrode receives light to be converted by the photodiode and permits the received light to substantially pass through the receiving electrode to the photodiode, the photodiode generates photogenerated carriers from the received light, the receiving electrode is electrically coupled with the photodiode to extract the photogenerated carriers from the germanium-based photodiode and conduct the collected photogenerated carriers to another component, and the receiving electrode is coupled closer to the doped region of the photodiode having a like doping to it than to the doped region of the photodiode having a different doping.

8. The apparatus as defined by claim 7 wherein the receiving electrode is doped with an n-type dopant, the receiving electrode being coupled closer to the n-type region of the photodiode than to the p-type region of the photodiode.

9. The apparatus as defined by claim 7 further comprising a bottom electrode coupled to photodiode, the apparatus further having a voltage between the top and bottom electrodes.

10. The apparatus as defined by claim 7 wherein the receiving electrode has a thickness of between about 0.1 and 0.3 microns.

11. The apparatus as defined by claim 7 wherein the receiving electrode has no less than about a ninety percent concentration of polysilicon.

12. The apparatus as defined by claim 7 wherein the receiving electrode includes polysilicon germanium.

13. A light conversion apparatus comprising:
a germanium-based photodiode; and
polysilicon-based means for receiving light to be converted by the photodiode, for extracting photogenerated carriers produced by the germanium-based photodiode as a result of converting the light and for conducting the collected photogenerated carriers to another component, wherein the polysilicon-based means permits the received light to substantially pass through it to the photodiode.

14. The apparatus as defined by claim 13 wherein the polysilicon-based means includes a receiving electrode comprised of at least ninety percent polysilicon.

15. The apparatus as defined by claim 13 wherein the polysilicon-based means includes doped polysilicon.

16. The apparatus as defined by claim 13 further comprising a bottom electrode having a voltage difference with the polysilicon-based means.

17. The apparatus as defined by claim 1 wherein a doping process dopes a portion of the photodiode after the receiving electrode is coupled with the photodiode.

18. The apparatus as defined in claim 1, wherein the photogenerated carriers comprise electrons.

19. The apparatus as defined in claim 1, wherein the photogenerated carriers comprise holes.

\* \* \* \* \*